(12) United States Patent  
Sakurai

(10) Patent No.: US 9,282,642 B2  
(45) Date of Patent: Mar. 8, 2016

(54) WIRING BOARD

(71) Applicant: KYOCERA SLC Technologies Corporation, Yasu-shi, Shiga (JP)

(72) Inventor: Keizou Sakurai, Yasu (JP)

(73) Assignee: KYOCERA CIRCUIT SOLUTIONS, INC., Kyoto (JP)

( * ) Notice: Subject to any disclaimer, the term of this patent is extended or adjusted under 35 U.S.C. 154(b) by 237 days.

(21) Appl. No.: 14/040,358

(22) Filed: Sep. 27, 2013

(65) Prior Publication Data

US 2014/0092569 A1    Apr. 3, 2014

(30) Foreign Application Priority Data

Sep. 28, 2012 (JP) ................................. 2012-217125  
Sep. 29, 2012 (JP) ................................. 2012-218941

(51) Int. Cl.
*H01L 23/12* (2006.01)  
*H01L 23/14* (2006.01)  
*H05K 1/18* (2006.01)  
*H05K 3/34* (2006.01)  
*H05K 3/46* (2006.01)  
*H01L 23/538* (2006.01)

(52) U.S. Cl.
CPC ............ *H05K 1/186* (2013.01); *H01L 23/5389* (2013.01); *H05K 3/4697* (2013.01); *H01L 23/5385* (2013.01); *H01L 2224/16225* (2013.01); *H01L 2924/1461* (2013.01); *H05K 3/3452* (2013.01); *H05K 3/4614* (2013.01); *H05K 2201/10977* (2013.01); *H05K 2201/2018* (2013.01); *H05K 2203/0588* (2013.01); *H05K 2203/061* (2013.01); *Y10T 29/49126* (2015.01)

(58) Field of Classification Search
CPC .......................... H01L 23/562; H01L 23/5389  
USPC ........... 257/778, 701, 702, 704, 783, E23.116  
See application file for complete search history.

(56) References Cited

U.S. PATENT DOCUMENTS

| 6,794,747 B2* | 9/2004 | Takehara | H01L 23/3677 257/701 |
| 7,737,562 B2* | 6/2010 | Higaki | H01L 24/97 257/701 |
| 7,777,328 B2* | 8/2010 | Enomoto | H01L 21/486 257/670 |
| 7,944,039 B2* | 5/2011 | Arai | H01L 21/568 257/690 |
| 2006/0202322 A1* | 9/2006 | Kariya | H01L 23/49827 257/698 |
| 2008/0277776 A1* | 11/2008 | Enomoto | H01L 21/486 257/700 |
| 2010/0059877 A1* | 3/2010 | Leib | B81C 1/0023 257/704 |

(Continued)

FOREIGN PATENT DOCUMENTS

JP        3161706 B2    2/2001

*Primary Examiner* — Nitin Parekh  
(74) *Attorney, Agent, or Firm* — Procopio Cory Hargreaves and Savitch LLP

(57) ABSTRACT

A wiring board includes a base wiring board 10 and a frame wiring board 20. The base wiring board 10 has an element mounting portion 1*a* and a frame-shaped frame joining portion 1*b* on the upper surface and a solder resist layer 4 deposited in a portion between the element mounting portion 1*a* and the frame joining portion 1*b*. In the wiring board 10, a first joining pad 6 provided in the frame joining portion 1*b* and a second joining pad 16 provided in a lower surface of the frame wiring board 20 are joined together via a solder bump H so that a gap may be formed between the frame joining portion 1*b* and the frame wiring board 20. The base wiring board 10 has a resin injection hole 8 penetrating through the base wiring board 10 in the frame joining portion 1*b*, and the gap is filled with a sealing resin 18.

6 Claims, 8 Drawing Sheets

(56) References Cited

U.S. PATENT DOCUMENTS

2010/0078205 A1* 4/2010 Sakai .................. H01L 23/5389
174/260

2012/0081864 A1* 4/2012 Sakurai ............. H01L 23/49822
361/753

2012/0270354 A1* 10/2012 Hooper ................. G01L 19/141
438/51

* cited by examiner

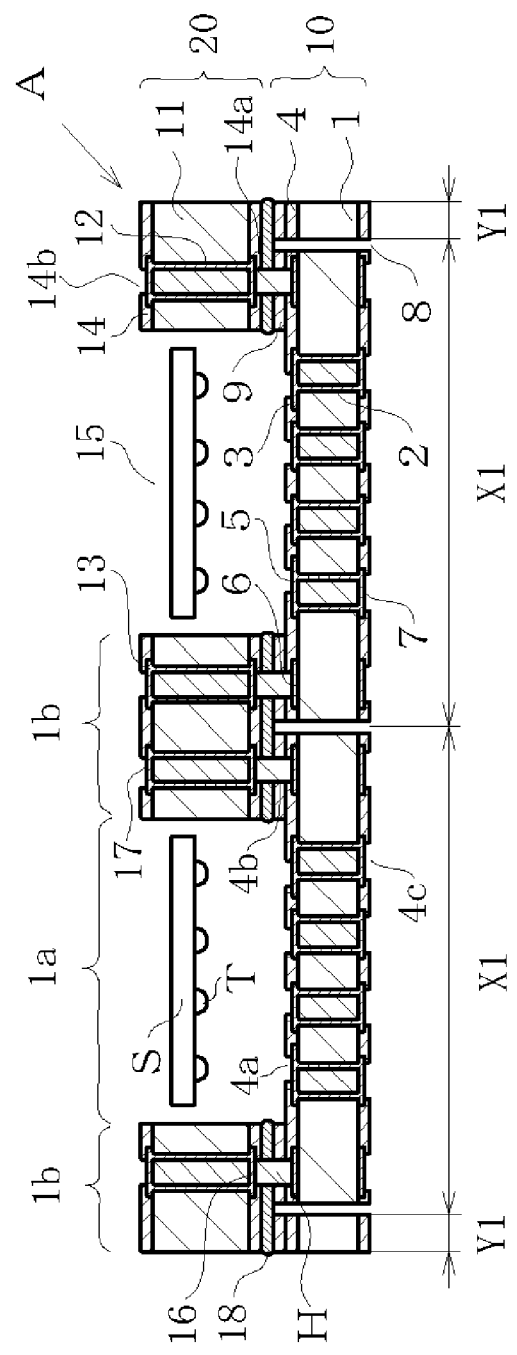

WIRING BOARD

BACKGROUND OF THE INVENTION

1. Field of the Invention

The present invention relates to a wiring board structured in such a manner that a frame wiring board having an opening, which surrounds an element mounting portion, is joined to an upper surface of a base wiring board having the element mounting portion in which a semiconductor element is mounted. The present invention also relates to a wiring board having a cavity for housing a semiconductor element therein.

2. Description of Related Art

A mounting semiconductor device is described in Japanese Patent No. 3161706. In the mounting semiconductor device, a semiconductor element is mounted on a substrate. FIGS. 6(a) and 6(b) illustrate a conventional wiring board B structured in such a manner that a base wiring board 130 for mounting a semiconductor element S thereon and a frame wiring board 140 are joined together. The wiring board B has a plurality of product regions X2 and a marginal region Y2 which is integrally formed and disposed to surround each of the product regions X2. A plurality of products are simultaneously manufactured by dicing the wiring board B along lines between the product regions X2 and lines between the product region X2 and the marginal region Y2.

The base wiring board 130 includes an insulating board 121 having a plurality of through holes 122 which penetrates from an upper surface to a lower surface, a wiring conductor layer 123 deposited on the upper and lower surfaces of the insulating board 121 and in the through holes 122, and a solder resist layer 124 deposited on the insulating board 121 and wiring conductor layer 123. The inside of each through hole 122 is filled with hole plugging resin. The wiring conductor layer 123 is formed by, for example, a good conductive material, such as copper foil or copper plating.

An element mounting portion 121a for mounting a semiconductor element S thereon is provided in the upper surface of the base wiring board 130. A plurality of semiconductor element connection pads 125 for electrical connection to electrodes T of the semiconductor element S are formed by a part of the wiring conductor layer 123 in the element mounting portion 121a. The semiconductor element connection pads 125 are exposed in an opening 124a provided in the solder resist layer 124. The semiconductor element S and base wiring board 130 are electrically connected to each other via solder bumps which connect the electrodes T of the semiconductor element S to the semiconductor element connection pads 125.

In the upper surface of the base wiring board 130, a frame-shaped frame joining portion 121b to which the frame wiring board 140 is to be joined is formed in a manner to surround the element mounting portion 121a. A plurality of first joining pads 126 for electrical connection to the frame wiring board 140 are formed by a part of the wiring conductor layer 123 in the frame joining portion 121b. The first joining pads 126 are exposed in an opening 124b provided in the solder resist layer 124. The first joining pads 126 and some of the semiconductor element connection pads 125 are electrically connected to each other. A plurality of external connection pads 127 for connection to an external electric circuit board are formed by a part of the wiring conductor layer 123 in the lower surface of the base wiring board 130. The external connection pads 127 are exposed in an opening 124c provided in the solder resist layer 124. The external connection pads 127 are electrically connected to the semiconductor element connection pads 125 via the through holes 122.

The frame wiring board 140 includes an insulating board 131 having a plurality of through holes 132 which penetrate from an upper surface to a lower surface, a wiring conductor layer 133 deposited on the insulating board 131 and in the through holes 132, and a solder resist layer 134 deposited on the upper and lower surfaces of the insulating board 131. The through holes 132 are filled with hole plugging resin. An opening 135 surrounding the element mounting portion 121a is formed in the frame wiring board 140. A plurality of second joining pads 136 are formed by a part of the wiring conductor layer 133 in the lower surface of the frame wiring board 140, in positions corresponding to the first joining pads 126 of the base wiring board 130. The second joining pads 136 are exposed in an opening 134a provided in the solder resist layer 134. The second joining pads 136 and the first joining pads 126 are joined together via solder bumps H. That is, a part of the wiring conductor layer 123 of the base wiring board 130 is electrically connected to the wiring conductor layer 133 of the frame wiring board 140. A plurality of third joining pads 137 are formed by a part of the wiring conductor layer 133 in the upper surface of the frame wiring board 140. The third joining pads 137 are exposed in the opening 134b provided in the solder resist layer 134. An additional wiring board or a conductive lid is joined to the third joining pads 137 in a manner to cover the opening 135.

In addition, in the frame joining portion 121b, a gap formed between the base wiring board 130 and the frame wiring board 140 is filled with sealing resin 138. The sealing resin 138 firmly joins the base wiring board 130 and the frame wiring board 140 together, and protects the semiconductor element S by preventing moisture and/or a foreign substance, which drifts from a junction where the base wiring board 130 and the frame wiring board 140 are joined to each other, from intruding into the element mounting portion 121a through the gap formed between the base wiring board 130 and the frame wiring board 140.

The following method is employed in order to join the frame wiring board 140 to the upper surface of the base wiring board 130. First, solder for forming the solder bumps H is welded onto at least one of the first joining pads 126 of the base wiring board 130 and the second joining pads 136 of the frame wiring board 140. For solder welding, a method of performing reflow treatment after printing solder paste, or a method of performing reflow treatment after mounting solder balls is used. Next, the frame wiring board 140 is mounted on the base wiring board 130 in such a manner that the first joining pads 126 and the corresponding second joining pads 136 face each other, respectively, and then the solder is reflowed, so that the first joining pads 126 and the second joining pads 136 will be joined together via the solder bumps H. In this case, in the frame joining portion 121b, the gap having a size as large as the height of the solder bump H is formed between the base wiring board 130 and the frame wiring board 140.

Next, in the frame joining portion 121b, liquid sealing resin 138 is injected into the gap formed between the base wiring board 130 and the frame wiring board 140 and then cured. In order to inject the liquid sealing resin 138 into the gap formed between the base wiring board 130 and the frame wiring board 140, the following method is employed: a plurality of resin injection holes 139 are formed in advance in the frame wiring board 140 in a manner to penetrate from the upper surface to the lower surface of the frame wiring board 140; and the sealing resin 138 is injected into the resin injection holes 139 from the upper surface side of the frame wiring board 140.

However, when the liquid sealing resin 138 is injected through this method, in some cases the liquid sealing resin 138 flows out of the frame joining portion 121b, continues to flow along the upper surface of the base wiring board 130, and reaches the element mounting portion 121a. As a result, the semiconductor element connection pads 125 are likely to be covered by the liquid sealing resin 138. For this reason, normal connection between the electrodes T of the semiconductor element S and the semiconductor element connection pads 125 will be inhibited, and the semiconductor element S is unlikely to stably operate.

A waterproof structure of an electronic device is described in Japanese Patent No. 3964555. The electronic device provides a substrate mounted electronic components, which is housed in a case opening at one side. FIG. 7 illustrates a semiconductor element housing wiring board B' having a cavity 159 for housing a semiconductor element S therein. The semiconductor element housing wiring board B' mainly includes a base wiring board 150 and a cap wiring board 180. The semiconductor element housing wiring board B' has a plurality of product regions X2 and a marginal region Y2 which is integrally formed and surrounds each of the product regions X2. A plurality of products are simultaneously manufactured by dicing the semiconductor element housing wiring board B' along lines between the product regions X2 and lines between the product region X2 and the marginal region Y2.

The base wiring board 150 includes an insulating board 141, a wiring conductor layer 143, and a solder resist layer 144. An element mounting portion 141a is provided in a center portion of an upper surface of each product region X2, and a frame-shaped cap joining portion 141b is provided in a periphery portion of the upper surface of each product region X2 in a manner to surround the corresponding element mounting portion 141a. A description about the insulating board 141, wiring conductor layer 143, and solder resist layer 144 is omitted because they have the same structures and functions as the insulating board 121, wiring conductor layer 123, and solder resist layer 124, respectively.

A plurality of first joining pads 146 for electrical connection to the cap wiring board 180 are formed by a part of the wiring conductor layer 143 in the cap joining portions 141b. The first joining pads 146 are exposed in an opening 144b provided in the solder resist layer 144. The first joining pads 146 and some of the semiconductor element connection pads 145 are electrically connected to each other, respectively. A plurality of external connection pads 147 for connection to an external electric circuit board are formed by a part of the wiring conductor layer 143 in a lower surface of the base wiring board 150. Each external connection pad 147 is exposed in an opening 144c provided in the solder resist layer 144. The external connection pads 147 are electrically connected to the semiconductor element connection pads 145 via the through holes 142.

The cap wiring board 180 is configured in such a manner that a plate-shaped upper wiring board 160 and a frame-shaped frame wiring board 170 are joined together. The upper wiring board 160 includes an insulating board 151, a wiring conductor layer 153, and a solder resist layer 154.

The insulating board 151 is a plate made of, for example, a resin-based insulating material, and has a plurality of through holes 152 penetrating from an upper surface to a lower surface of the insulating board 151. The wiring conductor layer 153 is formed by a good conductive material, such as copper foil or copper plating, for example. The wiring conductor layer 153 is deposited on the upper and lower surfaces of the insulating board 151 and on internal surfaces of the through holes 152 in a manner to have a predetermined pattern. The through holes 152 with the internal surfaces on which the wiring conductor layer 153 is deposited are filled with hole plugging resin. The solder resist layer 154 is formed by a resin-based insulating material and is deposited on the upper and lower surfaces of the insulating board 151, exposing a part of the wiring conductor layer 153.

A plurality of frame connection pads 155 for electrical connection to upper connection pads 165 of the frame wiring board 170 are formed by a part of the wiring conductor layer 153 in a lower surface of the upper wiring board 160. The frame connection pads 155 are exposed in an opening 154a provided in the solder resist layer 154. The upper wiring board 160 and frame wiring board 170 are electrically connected by connecting the upper connection pads 165 and the frame connection pads 155 via solder bumps. A gap formed between the upper wiring board 160 and the frame wiring board 170 is filled with resin. A description about the frame wiring board 170 is omitted because the frame wiring board 170 has the same structure and function as the frame wiring board 140.

The upper connection pads 165 for electrical connection to the frame connection pads 155 are formed by a part of the wiring conductor layer 163 in the upper surface of the frame wiring board 170. The upper connection pads 165 are exposed in an opening 164a provided in the solder resist layer 164. The frame connection pads 155 are connected to the upper connection pads 165 via solder bumps, and the gap formed between them is filled with resin. In this way, the cap wiring board 180 in which the upper wiring board 160 and the frame wiring board 170 are electrically connected to each other is formed. A plurality of resin injection holes 179 are arranged in a position corresponding to the cap joining portion 141b of the cap wiring board 180.

A plurality of second joining pads 166 for electrical connection to the first joining pads 146 are formed by a part of the wiring conductor layer 163 in the lower surface of the frame wiring board 170. The second joining pads 166 are exposed in an opening 164b provided in the solder resist layer 164. In addition, the cap wiring board 180 and the base wiring board 150 are electrically connected by connecting the first joining pads 146 and the second joining pads 166 via solder bumps.

In the cap joining portion 141b, a gap formed between the base wiring board 150 and the cap wiring board 180 is filled with sealing resin 158. The sealing resin 158 firmly joins the base wiring board 150 and the cap wiring board 180 together, and protects the semiconductor element S by preventing moisture and/or a foreign substance, which drifts from a gap in a junction where the base wiring board 150 is joined to the cap wiring board 180, from intruding into the element mounting portion 141a.

The following method is employed to join the cap wiring board 180 to the upper surface of the base wiring board 150. First, solder for forming solder bumps is welded on at least one of the first joining pads 146 of the base wiring board 150 and the second joining pads 166 of the cap wiring board 180. For solder welding, a method of performing reflow treatment after printing soldering paste, or a method of performing reflow treatment after mounting solder balls is used. Next, the cap wiring board 180 is mounted on the base wiring board 150 in such a manner that the first joining pads 146 and the corresponding second joining pads 166 face each other, respectively, and then the solder is reflowed, so that the first joining pads 146 and the second joining pads 166 will be joined together via the solder bumps. In this case, in the cap joining portion 141b, a gap having a size as large as the height of the solder bumps is formed between the base wiring board 150 and the cap wiring board 180.

Next, in the cap joining portion 141b, liquid sealing resin 158 is injected into the gap formed between the base wiring board 150 and the cap wiring board 180 and then cured. In order to inject the liquid sealing resin 158 into the gap formed between the base wiring board 150 and the cap wiring board 180, the following method is employed: a plurality of resin injection holes 179 are formed to penetrate from the upper surface to the lower surface in the cap wiring board 180; and the sealing resin 158 is injected into the resin injection holes 179 from the upper surface side of the cap wiring board 180.

Some semiconductor elements among the semiconductor elements S mounted on the semiconductor element-mounting wiring board B' may have a physical operation mechanism (for example micro electro mechanical system (MEMS)) disposed outside thereof. However, when the liquid sealing resin 158 is injected between the base wiring board 150 and the cap wiring board 180 using this injection method, the liquid sealing resin 158 may flow out so as to reach the base wiring board 150 within the cavity 159, and the sealing resin 158 is likely to cover the operation mechanism of the semiconductor element S. For this reason, the operation mechanism may not normally operate and the semiconductor element S is not likely to stably operate.

BRIEF SUMMARY OF THE INVENTION

An object of the present invention is to provide a wiring board which enables an electrode of a semiconductor element to be well connected to a semiconductor element connection pad by preventing sealing resin from flowing out to an element mounting portion of a base wiring board or a wiring board which enables the semiconductor element to stably operate by preventing inhibition of normal operation of the semiconductor element which is attributable to deposition of the sealing resin onto an operation mechanism of the semiconductor element.

According to one aspect, a wiring board includes a base wiring board having an element mounting portion and a frame-shaped frame joining portion surrounding the element mounting portion on an upper surface, and a solder resist layer deposited in a portion from the element mounting portion to the frame joining portion; and a frame wiring board which is joined to the frame joining portion and surrounds the element mounting portion, wherein a first joining pad provided in the frame joining portion of the base wiring board and a second joining pad provided in a lower surface of the frame wiring board are joined together via a solder bump so that a gap may be formed between the frame joining portion of the base wiring board and the frame wiring board, and the base wiring board has a resin injection hole penetrating through the base wiring board in the frame joining portion, and the gap is filled with a sealing resin.

According to another aspect, a method for manufacturing a wiring board includes: preparing a base wiring board having an element mounting portion and a frame-shaped frame joining portion surrounding the element mounting portion on an upper surface, wherein a first joining pad is formed in the frame joining portion, a solder resist layer is deposited in a portion from the element mounting portion to the frame joining portion, and a resin injection hole which penetrates from an upper surface to a lower surface of the base wiring board is formed in the frame joining portion; preparing a frame wiring board which has a shape surrounding the element mounting portion and provides a second joining pad in a lower surface of the frame wiring board; joining the first joining pad formed in the frame joining portion of the base wiring board to the second joining pad formed in the frame wiring board together via a solder bump so that a gap may be formed between the frame joining portion of the base wiring board and the frame wiring board; and injecting sealing resin into the gap through the resin injection hole in a state where the base wiring board faces up, and curing the sealing resin.

According to a further aspect, a semiconductor element housing wiring board includes: a base wiring board having an element mounting portion and a frame-shaped cap joining portion surrounding the element mounting portion on an upper surface, and a solder resist layer deposited in a portion from the element mounting portion to the cap joining portion; a semiconductor element mounted in the element mounting portion; and a cap wiring board which is joined to the cap joining portion and has a cavity, in which the semiconductor element is housed, between the cap wiring board and an upper surface of the base wiring board, wherein a first joining pad provided in the cap joining portion of the base wiring board and a second joining pad provided in a lower surface of the cap wiring board are joined together via a solder bump so that a gap may be formed between the cap joining portion of the base wiring board and the cap wiring board, the base wiring board has a resin injection hole penetrating through the base wiring board in the cap joining portion, and the gap is filled with a sealing resin.

According to a yet further aspect, a method for manufacturing a semiconductor element housing wiring board, includes: preparing a base wiring board having an element mounting portion and a frame-shaped cap joining portion surrounding the element mounting portion on an upper surface, wherein a first joining pad is formed in the cap joining portion, a solder resist layer is deposited in a portion from the element mounting portion to the cap joining portion, and a resin injection hole which penetrates from the upper surface to a lower surface of the base wiring board is formed in the cap joining portion; preparing a cap wiring board which forms a cavity, in which a semiconductor element is housed, between the cap wiring board and the base wiring board by being joined onto the cap joining portion in such a manner as to cover the semiconductor element; mounting a semiconductor element in the element mounting portion; joining the first joining pad formed in the cap joining portion of the base wiring board and a second joining pad formed in the cap wiring board together via a solder bump so that a gap may be formed between the cap joining portion of the base wiring board and the cap wiring board; and injecting sealing resin into the gap through the resin injection hole in a state where the base wiring board faces up.

According to the present invention, the sealing resin is made to fill up the gap formed between the solder resist layer on the base wiring board, and the frame wiring board or the cap wiring board by being injected through the resin injection hole formed in the base wiring board in a state where the base wiring board faces up. Therefore, it is possible to provide a wiring board in which sealing resin is difficult to flow onto an element mounting portion of a base wiring board and is not likely to cover a semiconductor element connection pad or an operation mechanism for a semiconductor element and thus which enables the semiconductor element to stably operate.

BRIEF DESCRIPTION OF THE DRAWINGS

FIGS. 1(a) and 1(b) are a schematic cross-sectional view and a plan view, respectively illustrating an embodiment of a wiring board according to the present invention.

DETAILED DESCRIPTION OF EXEMPLARY EMBODIMENTS

Figure 1B:
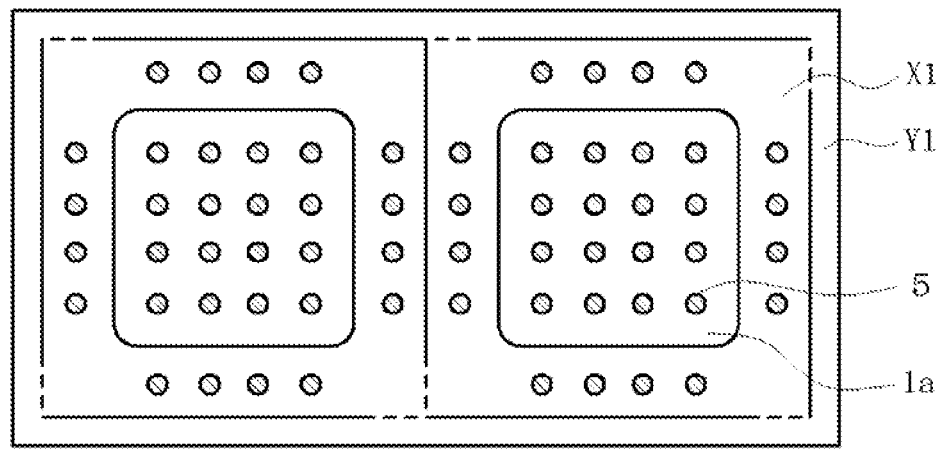

Next, one embodiment of a wiring board according to the present invention is described with reference to FIGS. 1(a), 1(b), and 2.

FIG. 1(a) illustrates an example of a wiring board A structured in such a manner that a base wiring board 10 for mounting a semiconductor element S thereon and a frame wiring board 20 are joined together. The wiring board A has a plurality of product regions X1 and a marginal region Y1 which is integrally formed and surrounds the periphery of each product region X1. A plurality of products are simultaneously manufactured by dicing the wiring board A along lines between the product regions X1 and lines between the product region X1 and the marginal region Y1.

The base wiring board 10 includes an insulating board 1 having a plurality of through holes 2 which penetrate from an upper surface to a lower surface, a wiring conductor layer 3 deposited on the upper and lower surfaces of the insulating board 1 and in the through holes 2, and a solder resist layer 4 deposited on the insulating board 1 and the wiring conductor layer 3. The inside of the through holes 2 is filled with hole plugging resin (for example, epoxy resin, polyimide resin, or the like).

An element mounting portion 1a for mounting thereon a semiconductor element S is formed in the upper surface of the base wiring board 10. A plurality of semiconductor element connection pads 5 for electrical connection to electrodes T of the semiconductor element S are formed by a part of the wiring conductor layer 3 in the element mounting portion 1a. The semiconductor element connection pads 5 are exposed in an opening 4a provided in the solder resist layer 4. The semiconductor element S and the base wiring board 10 are electrically connected by connecting the electrodes T of the semiconductor element S to the semiconductor element connection pads 5 via solder bumps H. A frame-shaped frame joining portion 1b, to which the frame wiring board 20 is to be joined, is provided in a manner to surround the element mounting portion 1a in the upper surface of the base wiring substrate 10. A plurality of first joining pads 6 for electrical connection to the frame wiring board 20 are formed by a part of the wiring conductor layer 3 in the frame joining portion 1b. The first joining pads 6 are exposed in an opening 4b provided in the solder resist layer 4. Some of the first joining pads 6 and the semiconductor element connection pads 5 are electrically connected to each other, respectively.

A plurality of external connection pads 7 for connection to an external electric circuit board are formed by a part of the wiring conductor layer 3 in the lower surface of the base wiring board 10. The external connection pads 7 are exposed in an opening 4c provided in the solder resist layer 4. The external connection pads 7 are electrically connected to the semiconductor element connection pads 5 via the through holes 2. A plurality of resin injection holes 8 are formed in a manner to penetrate from the lower surface to the upper surface of the base wiring board 10. Sealing resin 18 described below is injected into a gap formed between the frame wiring board 20 and the frame joining portion 1b of the base wiring board 10 through the resin injection holes 8.

The frame wiring board 20 includes an insulating board 11 having a plurality of through holes 12 penetrating from an upper surface to a lower surface, a wiring conductor layer 13 deposited on the insulating board 11 and in the through holes 12, and a solder resist layer 14 deposited on the upper and lower surfaces of the insulating board 11. The inside of the through holes 12 is filled with the above-mentioned hole plugging resin. An opening 15 having a size as large as it can surround the element mounting portion 1a with its edge is formed in the frame wiring board 20. A plurality of second joining pads 16 are formed by a part of the wiring conductor layer 13 in the lower surface of the frame wiring board 20, in positions corresponding to the first joining pads 6 of the base wiring board 10. The second joining pads 16 are exposed in an opening 14a provided in the solder resist layer 14. The second joining pads 16 and the first joining pads 6 are joined to each other via solder bumps H, and thus a part of the wiring conductor layer 3 of the base wiring board 10 and the wiring conductor layer 13 of the frame wiring board 20 are electrically connected to each other.

A plurality of third joining pads 17 are formed by a part of the wiring conductor layer 13 in the upper surface of the frame wiring board 20. The third joining pads 17 are exposed in an opening 14b provided in the solder resist layer 14. An additional wiring board or a conductive lid is joined to the third joining pads 17 in a manner to cover the opening 15. In addition, a gap formed between the frame joining portion 1b of the base wiring board 10 and the frame wiring board 20 is filled with sealing resin 18. Not only the sealing resin 18 firmly joins the base wiring board 10 and the frame wiring board 20 together, but also the sealing resin 18 protects the semiconductor element S by preventing moisture and/or a foreign substance, which drifts from a joint where the base wiring board 10 and the frame wiring board 20 are joined together, from intruding into the element mounting portion 1a through the gap. Examples of the sealing resin 18 include an epoxy resin, polyimide resin, or the like without being limited in particular. The sealing resin 18 retains the gap formed between the frame joining portion 1b of the base wiring board 10 and the frame wiring board 20 due to surface tension of the sealing resin 18.

The insulating boards 1 and 11 are formed by electrically insulating materials obtained by impregnating a glass cloth with thermosetting resin, such as an epoxy resin or bismaleimide triazine resin, for example. The wiring conductor layers 3 and 13 are formed by good conductivity materials, such as copper foil and copper plating. The solder resist layers 4 and 14 are formed by electrically insulating materials obtained by curing photosensitive thermosetting resin, such as an acrylic modification epoxy resin, for example.

Figure 2:
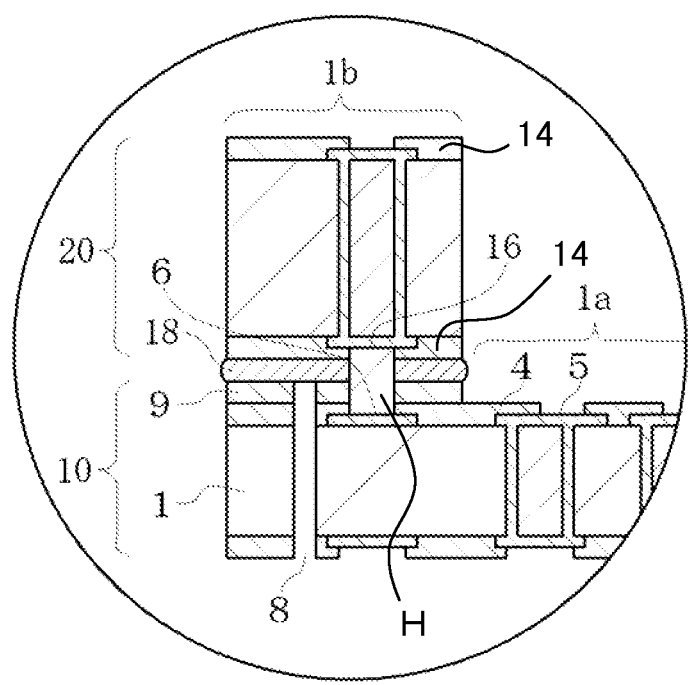
FIG. 2 is an enlarged cross-sectional view illustrating a main part of the wiring board illustrated in FIGS. 1(a) and 1(b).

In the wiring board A of the present invention, as illustrated in FIG. 2, a frame-shaped protrusion 9 may be formed on the solder resist layer 4 in the frame joining portion 1b of the base wiring board 10. The protrusion 9 is formed by substantially the same solder resist materials as the solder resist layer 4, and is formed to surround the element mounting portion 1a. The protrusion 9 has preferably a thickness of approximately 0.005 to 0.05 mm. Ina case where the wiring board A of the present invention includes the protrusion 9, a gap formed between the protrusion 9 and the frame wiring board 20 is filled with the sealing resin 18. When the gap formed between the frame joining portion 1b of the base wiring board 10 and the frame wiring board 20 is wide, the gap is filled with a large amount of the resin. As a result, the resin receives a force crushed by its own weight. If the force is stronger than surface tension of the resin, the resin flows into the element mounting portion 1a of the base wiring board. The protrusion 9 is provided in order to make the gap narrower.

Figure 3A:
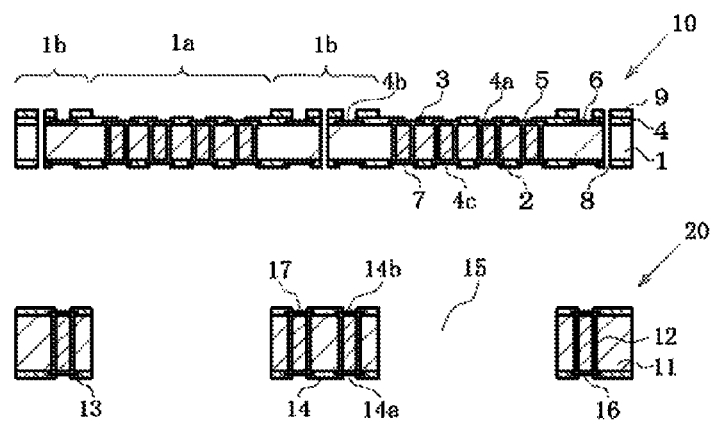
FIGS. 3(a) to 3(c) are schematic cross-sectional views illustrating states of processes of a method for manufacturing the wiring board illustrated in FIGS. 1(a) and 1(b).
Figure 3B:
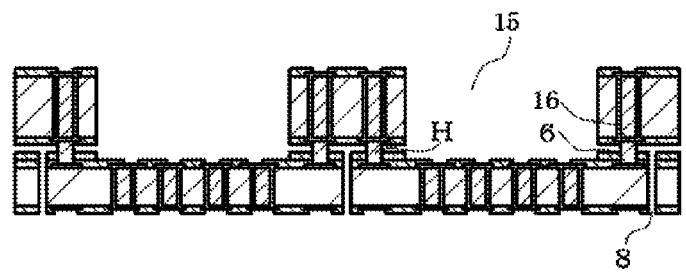
Figure 3C:
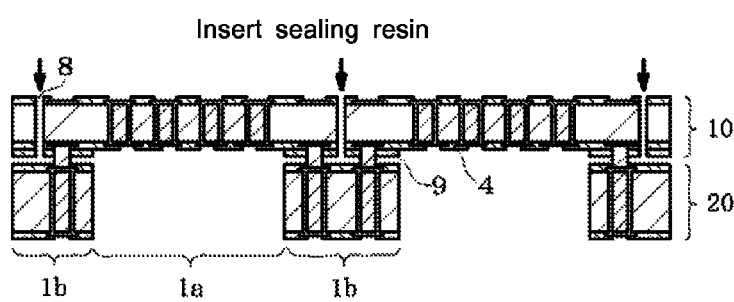

Next, an example of a method for manufacturing a wiring board according to the present invention is described in detail with reference to FIGS. 3(a) to 3(c). In FIGS. 3(a) to 3(c), members the same as the members included in the wiring board A described with reference to FIG. 1 are denoted by the same reference numerals and a description about them is omitted. First, as illustrated in FIG. 3(a), a base wiring board 10 and a frame wiring board 20 are prepared.

The base wiring board 10 includes an insulating board 1 having a plurality of through holes 2 which penetrate from an upper surface to a lower surface, a wiring conductor layer 3 deposited on the upper and lower surfaces of the insulating board 1 and in the through holes 2, and a solder resist layer 4 deposited on the insulating board 1 and wiring conductor layer 3. A frame-shaped frame joining portion 1b which surrounds an element mounting portion 1a and an element mounting portion 1a is formed on the upper surface of the base wiring board 10. A plurality of semiconductor element connection pads 5 are formed in the element mounting portion 1a. A plurality of first joining pads 6 are formed in the frame joining portion 1b. External connection pads 7 are formed in the lower surface of the base wiring board 10. The semiconductor element connection pads 5, first joining pads 6, and external connection pads 7 are correspondingly electrically connected to one another, respectively. A solder resist layer 4 on the upper surface side is deposited in a portion from the element mounting portion 1a in the upper surface of the base wiring board 10 to the frame joining portion 1b. The solder resist layer 4 on the upper surface side has an opening 4a, which exposes the semiconductor element connection pads 5, in the element mounting portion 1a, and an opening 4b, which exposes the first joining pads 6, in the frame joining portion 1b. In the solder resist layer 4 on the upper surface side, a frame-shaped protrusion 9 is formed in the frame joining portion 1b. The solder resist layer 4 on the lower surface side has an opening 4c which exposes the external connection pads 7 therein. In addition, the base wiring board 10 has a plurality of resin injection holes 8 which penetrate from the lower surface up to the upper surface of the base wiring board 10.

The base wiring board 10 is formed as follows, for example. First, a both-sided copper-clad plate is prepared. The both-sided copper-clad plate is structured in such a manner that copper foil of about 12 to 18 μm is deposited on both surfaces of an insulating plate prepared by impregnating a glass cloth with thermosetting resin, such as an epoxy resin and bismaleimide triazine resin. Next, a plurality of through holes 2 having an inner diameter of about 50 to 300 μm are formed by drilling, laser processing, or blast processing. Next, a copper plating layer is formed on the internal surfaces of the through holes 2, and the wiring conductor layer 3 having a predetermined pattern is formed on the insulating plate and in the through holes 2 using a well-known subtractive process. Next, a solder resist layer 4 on the upper surface side which has an opening 4a exposing the semiconductor element connection pads 5 therein and an opening 4b exposing the first joining pads 6 therein, and a solder resist layer 4 on the lower surface side which has an opening 4c exposing the external connection pads 7 therein are formed. Next, a protrusion 9 formed by the substantially same solder resist material as the solder resist layer 4 is formed on the frame joining portion 1b in the solder resist layer 4 on the upper surface side. Next, resin injection holes 8 having an inner diameter of about 0.8 to 2 mm which penetrates through the frame joining portion 1b of the base wiring board 10 and through the protrusion 9 are formed by drilling, so that the base wiring board 10 is obtained.

As described above, the frame wiring board 20 includes an insulating board 11 having a plurality of through holes 12 which penetrate from an upper surface to a lower surface, a wiring conductor layer 13 deposited on the surfaces of the insulating board 11 and in the through holes 12, and a solder resist layer 14 deposited on the upper and lower surfaces of the insulating board 11. And it has an opening 15 having a size as large as its edge can surround the element mounting portion 1a, in the position corresponding to the element mounting portion 1a of the base wiring board 10. An opening size of the opening 15 is a dimension corresponding to the inner diameter of the protrusion 9. In the lower surface of the frame wiring board 20, a plurality of second joining pads 16 are formed in positions corresponding to the first joining pads 6 of the base wiring board 10. Third joining pads 17 are formed on the upper surface of the frame wiring board 20. The solder resist layer 14 on the lower surface has an opening 14a in which the second joining pads 16 are exposed. The solder resist layer 14 on the upper surface has an opening 14b in which the third joining pads 17 are exposed.

The frame wiring board 20 is formed as follows, for example. First, a both-sided copper-clad plate is prepared. The both-sided copper-clad plate is structured in such a manner that copper foil having a thickness of about 12 to 18 μm is deposited on both surfaces of an insulating plate prepared by impregnating a glass cloth with thermosetting resin, such as an epoxy resin and bismaleimide triazine resin. Next, a plurality of through holes 12 having an inner diameter of about 50 to 300 μm are formed by drilling, laser processing, or blast processing, and an opening 15 is formed by router processing, laser processing, or blast processing. Next, a copper plating layer is deposited in the through holes 12, and a wiring conductor layer 13 having a predetermined pattern is formed on the electric insulating plate and in the through holes 12 using a well-known subtractive process. Next, a solder resist layer 14 on the lower surface side which has an opening 14a, in which the second joining pads 16 are exposed, is formed and a solder resist layer 14 on the upper surface side which has an opening 14b, in which the third joining pads 17 are exposed, is formed.

Next, as illustrated in FIG. 3(b), the base wiring board 10 and the frame wiring board 20 are arranged in such a manner that the first joining pads 6 face the corresponding second joining pads 16, respectively and the first joining pads 6 and the second joining pads 16 facing each other are joined together via solder bumps H. The joining via the solder bumps H is obtained as follows, for example. First, solder for forming the solder bumps H is welded on at least one of the first joining pads 6 and the second joining pads 16. Next, the frame wiring board 20 is placed on the base wiring board 10 in such a manner that the first joining pads 6 and the corresponding second joining pads 16 face each other, respectively. Next, solder is molten by reflow treatment and the first joining pads 6 and the corresponding second joining pads 16 are joined together via the solder bumps H.

Next, as illustrated in FIG. 3(c), liquid sealing resin 18 is injected into the gap formed between the protrusion 9 and the frame wiring board 20 through the resin injection holes 8 in a state where the frame wiring board 20 faces down. In this case, the liquid sealing resin 18 is injected such as not to flow out to the solder resist layer 4 disposed on inner side than the protrusion 9. That is, it is possible to prevent the sealing resin 18 from flowing out to the upper surface of the solder resist layer 4 (element mounting portion 1*a*) disposed on the inner side than the protrusion 9 by injecting the sealing resin 18 through the resin injection holes 8 in a state where the frame wiring board 20 faces down. In the method for manufacturing the wiring board A according to the present invention, the protrusion 9 is formed to surround the element mounting portion 1*a*, on the solder resist layer 4 in the frame joining portion 1*b* of the base wiring board 10. For this reason, as described above, it becomes difficult for the sealing resin 18 to flow out onto the solder resist layer 4 (element mounting portion 1*a*) disposed on the inner side than the protrusion 9 due to surface tension of the sealing resin 18.

Finally, the sealing resin 18 injected between the protrusion 9 and the frame board 20 is cured, so that the wiring board A shown in FIG. 1 will be completed. Since the sealing resin 18 is injected in such a manner that it does not flow out onto the solder resist layer 4 disposed on the inner side than the protrusion 9, the semiconductor element connection pad 5 are not covered by the sealing resin 18. Therefore, it is possible to provide the wiring board A which enables the electrodes T of the semiconductor element S to be well connected to the semiconductor element connection pads 5 and enables the semiconductor element S to stably operate.

Next, another embodiment of the wiring board according the present invention is described with reference to FIG. 4.

Figure 4:
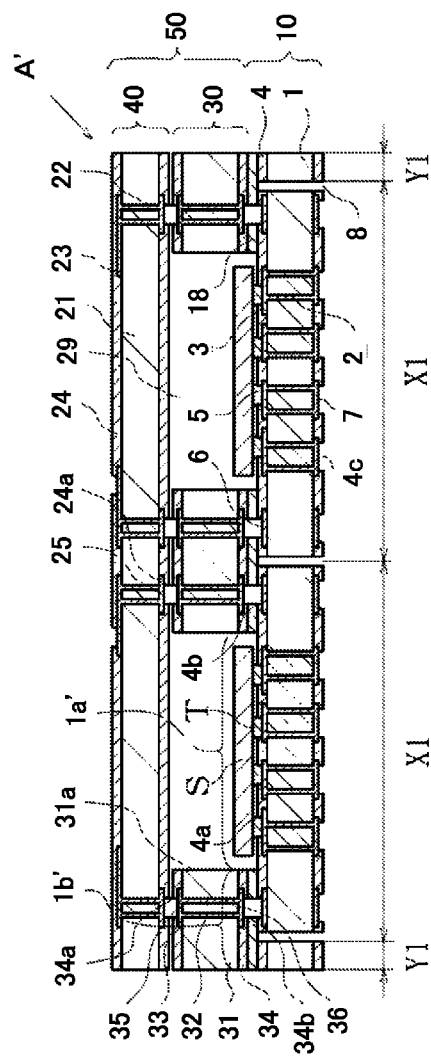
FIG. 4 is a schematic cross-sectional view illustrating another embodiment of the wiring board according to the present invention.

FIG. 4 illustrates a semiconductor element housing wiring board A' with a cavity 29 for housing a semiconductor element S therein. The semiconductor element housing wiring board A' mainly includes a base wiring board 10 and a cap wiring board 50. The semiconductor element housing wiring board A' has a plurality of product regions X1 and a marginal region Y1 which is integrally formed in the periphery of each product region X1, and a plurality of products are simultaneously manufactured by dicing the semiconductor element housing wiring board A' along lines between the product regions X1 and lines between the product region X1 and the marginal region Y1. Hereinafter, elements the same as in the above-described wiring board are denoted by the same reference numerals.

The base wiring board 10 includes an insulating board 1 having a plurality of through holes 2 penetrating from an upper surface to a lower surface, a wiring conductor layer 3 deposited on the upper and lower surfaces of the insulating board 1 and in the through holes 2, and a solder resist layer 4 deposited on the insulating board 1 and the wiring conductor layer 3. The insulating board 1, through holes 2, wiring conductor layer 3, and solder resist layer 4 are the same as described above, a description about them is omitted.

A plurality of semiconductor element connection pads 5 for electrical connection to electrodes T of a semiconductor element S are formed in an element mounting portion 1*a*' in the upper surface of the base wiring board 10 by a part of the wiring conductor layer 3. The semiconductor element connection pads 5 are exposed in an opening 4*a* provided in the solder resist layer 4. The semiconductor element S and the base wiring board 10 are electrically connected by connecting the electrodes T of the semiconductor element S to the semiconductor element connection pads 5 via solder bumps.

A plurality of first joining pads 6 for electrical connection to the cap wiring board 50 are formed by a part of the wiring conductor layer 3 in a cap joining portion 1*b*' in the upper surface of the base wiring board 10. The first joining pads 6 are exposed in an opening 4*b* provided in the solder resist layer 4. Some of the first joining pads 6 and the semiconductor element connection pads 5 are electrically connected to each other, respectively. In addition, a plurality of external connection pads 7 for connection to an external electric circuit board are formed by a part of the wiring conductor layer 3 in the lower surface of the base wiring board 10. The external connection pads 7 are exposed in an opening 4*c* provided in the solder resist layer 4. The external connection pads 7 are electrically connected to the semiconductor element connection pads 5 via the through holes 2. A plurality of resin injection holes 8 are arranged in the cap joining portion 1*b*' of the base wiring board 10.

The cap wiring board 50 is structured in such a manner that a plate-shaped upper wiring board 40 and a frame-shaped frame wiring board 30 are joined together. The upper wiring board 40 includes an insulating board 21, a wiring conductor layer 23, and a solder resist layer 24.

The insulating board 21 is a plate made of a resin-based insulating material, for example, and has a plurality of through holes 22 penetrating from the upper surface to the lower surface. The wiring conductor layer 23 is formed of a good conductive material, such as copper foil or copper plating, for example, and is deposited on the upper and lower surfaces of the insulating board 21 and the internal surfaces of the through holes 22, forming a predetermined pattern. The through holes 22 with the internal surfaces on which the wiring conductor layer 23 is deposited are filled with hole plugging resin. For example, the solder resist layer 24 is formed by the resin-based insulating material which is described above in regard to the solder resist layer 4 and is deposited in such a manner that a part of the wiring conductor layer 23 is exposed from the upper and lower surfaces of the insulating board 21.

A plurality of frame connection pads 25 for electrical connection to upper connection pads 35 of the frame wiring board 30 described below are formed by a part of the wiring conductor layer 23 in the lower surface of the upper wiring board 40. The frame connection pads 25 are exposed in an opening 24*a* provided in the solder resist layer 24. The upper wiring board 40 and frame wiring board 30 are electrically connected to each other by connecting the upper connection pads 35 to the frame connection pads 25 via solder bumps. A gap formed between the upper wiring board 40 and frame wiring board 30 is filled with resin.

The frame wiring board 30 includes an insulating board 31, a wiring conductor layer 33, and a solder resist layer 34, and has an opening 31*a* which surrounds an element mounting portion 1*a*' with its edge.

The insulating board 31 is made of a resin-based insulating material, for example, and has a plurality of through holes 32 penetrating from the upper surface to the lower surface in a position around the opening 31*a*. The wiring conductor layer 33 is formed of a good conductive material, such as copper foil or copper plating and is deposited on the upper and lower surfaces of the insulating board 31 and the internal surfaces of the through holes 32, forming a predetermined pattern. The through holes 32 with the internal surfaces on which the wiring conductor layer 33 is deposited are filled with hole plugging resin. The solder resist layer 34 is formed by a resin-based insulating material, and is deposited on the upper and lower surfaces of the insulating board 31 in such a manner that a part of the wiring conductor layer 33 is exposed.

The upper connection pads 35 for electrical connection to the frame connection pads 25 are formed by a part of the wiring conductor layer 33 in the upper surface of the frame wiring board 30. The upper connection pads 35 are exposed in an opening 34a provided in the solder resist layer 34. As described above, by connecting the frame connection pads 25 to the upper connection pads 35 via solder bumps and filling up a gap formed between them with resin, the cap wiring board 50 structured in such a manner that the upper wiring board 40 and the frame wiring board 30 are electrically connected to each other is formed.

A plurality of second joining pads 36 for electrical connection to the first joining pads 6 are formed by a part of the wiring conductor layer 33 in the lower surface of the frame wiring board 30 which constitutes the cap wiring board 50. The second joining pads 36 are exposed in an opening 34b provided in the solder resist layer 34. The cap wiring board 50 and the base wiring board 10 are electrically connected to each other by connecting the first joining pads 6 to the second joining pads 36 via solder bumps.

Furthermore, in the semiconductor element housing wiring board A' of the present example, the gap formed between the cap joining portion 1b' of the base wiring board 10 and the cap wiring board 50 is filled with the sealing resin 18, and the sealing resin 18 is retained between the cap joining portion 1b' and the cap wiring board 50 so that the sealing resin 18 may not flow into the base wiring board 10 disposed in the cavity 29. Therefore, according to the semiconductor element housing wiring board A' of the present example, the sealing resin 18 is prevented from covering an operation mechanism of the semiconductor element S. Accordingly, it is possible to provide the semiconductor element housing wiring board A' which enables the semiconductor element S to stably operate. Preferably, the sealing resin 18 is injected into the gap formed between the cap joining portion 1b' and the cap wiring board 50 through the resin injection holes 8 in a state where the base wiring board 10 faces up. Because the injection is performed in this way, when the sealing resin 18 is injected into the gap formed between the cap joining portion 1b' and the cap wiring board 50, it is easy to retain the sealing resin 18 so that the sealing resin 18 may not flow out onto the base wiring board 10 disposed in the cavity 29 as described below. The sealing resin 18 is the same as the sealing resin described above, a description about it is omitted.

Figure 5A:
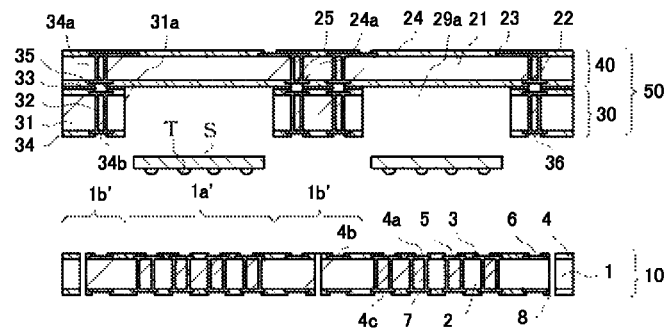
FIGS. 5(a) to 5(d) are schematic cross-sectional views illustrating states of processes of a method for manufacturing the wiring board illustrated in FIG. 4.

Next, an example of a method for manufacturing a wiring board according to the present invention is described in detail with reference to FIGS. 5(a) to 5(d). In FIGS. 5(a) to 5(d), the same members as in the semiconductor element housing wiring board A' which has been described with reference to FIG. 4 are denoted by the same reference numerals and a description about them is omitted. First, as illustrated in FIG. 5(a), a base wiring board 10, a semiconductor element S, and a cap wiring board 50 are prepared.

As described above, the base wiring board 10 includes an insulating board 1 having a plurality of through holes 2 which penetrate from an upper surface to a lower surface, a wiring conductor layer 3 deposited on the upper and lower surfaces of the insulating board 1 and in the through holes 2, and a solder resist layer 4 deposited on the insulating board 1 and wiring conductor layer 3. A frame-shaped cap joining portion 1b' which surrounds an element mounting portion 1a' and an element mounting portion 1a' are formed on the upper surface of the base wiring board 10. A plurality of semiconductor element connection pads 5 are formed in the element mounting portions 1a'. A plurality of first joining pads 6 are formed in the cap joining portion 1b'. External connection pads 7 are formed in the lower surface of the base wiring board 10. The semiconductor element connection pads 5, first joining pads 6, and external connection pads 7 are correspondingly, electrically connected to one another, respectively. The solder resist layer 4 on the upper surface side is deposited in a manner to penetrate from the element mounting portion 1a' in the upper surface of the base wiring board 10 to the cap joining portion 1b'. The solder resist layer 4 on the upper surface side has an opening 4a, which exposes the semiconductor element connection pads 5 therein, in the element mounting portion 1a' and an opening 4b, which exposes the first joining pads 6 therein, in the cap joining portion 1b'. The solder resist layer 4 on the lower surface side has an opening 4c which exposes the external connection pads 7 therein. In addition, the base wiring board 10 has a plurality of resin injection holes 8 penetrating from the lower surface to the upper surface of the base wiring board 10. The base wiring board 10 is formed according to the manufacturing method of the wiring board A which has been described above, for example.

As described above, the cap wiring board 50 is structured in such a manner that an upper wiring board 40 and a frame wiring board 30 are joined together. The upper wiring board 40 includes an insulating board 21, a wiring conductor layer 23 deposited on an upper surface and a lower surface of the insulating board 21, and a solder resist layer 24 deposited on the upper and lower surfaces of the insulating board 21. In addition, the frame wiring board 30 includes an insulating board 31, a wiring conductor layer 33 deposited on an upper surface and a lower surface of the insulating board 31, and a solder resist layer 34 deposited on the upper and lower surfaces of the insulating board 31. The cap wiring board 50 has a housing portion 29a, which forms a cavity 25 for housing the semiconductor element S therein, between itself and the upper surface of the base wiring board 10. An opening size of the housing portion 29a is a dimension corresponding to an inner diameter of the cap joining portion 1b'. A plurality of second joining pads 36 are formed in the lower surface of the cap wiring board 50 in positions corresponding to the first joining pads 6 formed in the base wiring board 10. The solder resist layer 34 has an opening 34b which exposes the second joining pads 36.

The cap wiring board 50 is formed as follows, for example. Firstly, the upper wiring board 40 is formed in the following procedure. A both-sided copper-clad sheet is prepared. The both-sided copper-clad sheet is structured in such a manner that copper foil of about 12 to 18 μm is deposited on both surfaces of a first insulating plate prepared by impregnating a glass cloth with thermosetting resin, such as an epoxy resin and bismaleimide triazine resin. Next, the wiring conductor layer 23 having a predetermined pattern is formed on the surface of the first insulating plate using a well-known subtractive process. Next, the solder resist layer 24 having the opening 24a which exposes the frame connection pads 25 is formed on the surface of the first insulating plate, so that the upper wiring board 40 is obtained. Subsequently, the frame wiring board 30 is formed in the following procedure.

First, a both-sided copper-clad sheet with copper foil is prepared. The both-sided copper-clad sheet with copper foil is structured in such a manner that copper foil of about 12 to 18 μm is deposited on both surfaces of a second insulating plate prepared by impregnating a glass cloth with thermosetting resin, such as an epoxy resin and bismaleimide triazine resin. Next, the wiring conductor layer 33 having a predetermined pattern is formed on the surface of the second insulating plate by a well-known subtractive process. Next, the solder resist layer 34 having the opening 34a which exposes the upper connection pads 35 is formed in the upper surface of the second insulating plate. The solder resist layer 34 having the opening 34b which exposes the second joining pads 36 is formed in the lower surface of the second insulating plate. Next, the opening 31a is formed in a position at which the opening 31a surrounds an element mounting portion 1a' by router processing or laser processing. In addition, solder paste is printed and welded on the upper connection pads 35, and the upper wiring board 40 is placed on the frame wiring board 30 in such a manner that the upper connection pads 35 face the corresponding frame connection pads 25, respectively. In addition, reflow treatment is performed so that the cap wiring board 50, in which the upper wiring board 40 and frame wiring board 30 are electrically connected via solder bumps, will be formed. Then, resin is injected to a gap formed between the upper wiring board 40 and the frame wiring board 30.

Figure 5B:
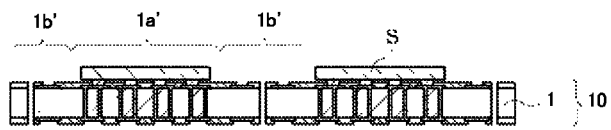

Next, as illustrated in FIG. 5(b) the base wiring board 10 and the semiconductor element S are arranged in such a manner that the semiconductor element connection pads 5 and the electrodes T of the semiconductor element S, respectively corresponding to each other, face each other, and the semiconductor element connection pads 5 and the electrodes T of the semiconductor element S, facing each other, are joined together via the solder bumps. The joining via the solder bumps is performed as follows, for example. First, solder for forming the solder bumps is welded on the semiconductor element connection pads 5. Next, the semiconductor element S is placed in the element mounting portion 1a' of the base wiring board 10 in such a manner that the semiconductor element connection pads 5 and the electrodes T of the semiconductor element S, corresponding to each other, respectively, face each other. Next, the solder is molten by reflow treatment and the electrodes T of the semiconductor element S are correspondingly joined to the semiconductor element connection pads 5, respectively via the solder bumps.

Figure 5C:
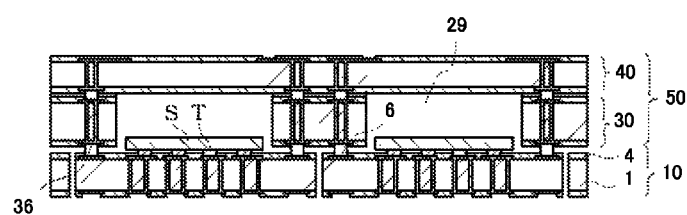

Next, as illustrated in FIG. 5(c), the base wiring board 10 and the cap wiring board 50 are arranged in such a manner that the first joining pads 6 and the corresponding second joining pads 36 face each other, respectively, and the first joining pads 6 and the corresponding second joining pads 36 are joined together via the solder bumps. In addition, the joining via the solder bumps is performed as follows, for example. First, solder for forming the solder bumps is welded on at least one of the first joining pads 6 and the second joining pads 36. Next, the cap wiring board 50 is placed on the base wiring board 10 in such a manner that the first joining pads 6 and the corresponding second joining pads 36 may face each other. Next, the solder is molten by reflow treatment, and thus the first joining pads 6 and the corresponding second joining pads 36 are joined together via solder bumps. This process produces the cavity 29 for housing the semiconductor element S.

Figure 5D:
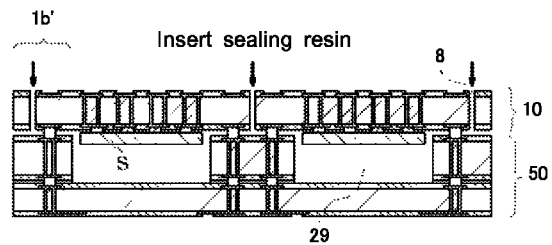
Figure 6A:
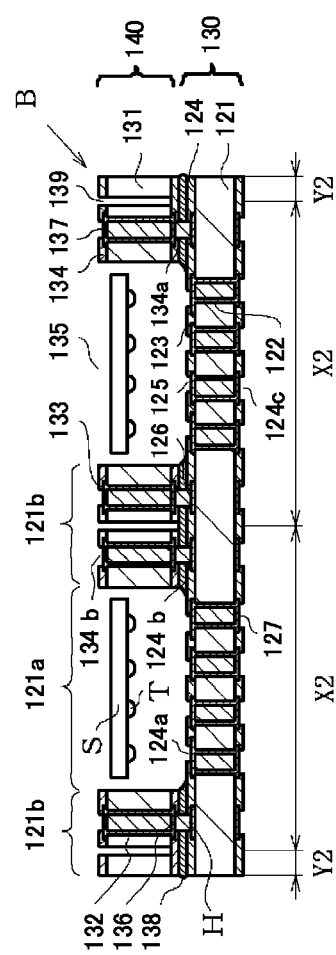
FIGS. 6 (a) and (b) are a schematic cross-sectional view and a plan view, respectively illustrating an example of a conventional wiring board.
Figure 6B:
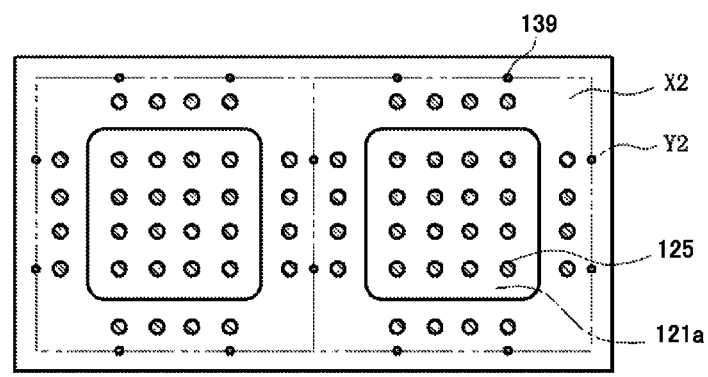
Figure 7:
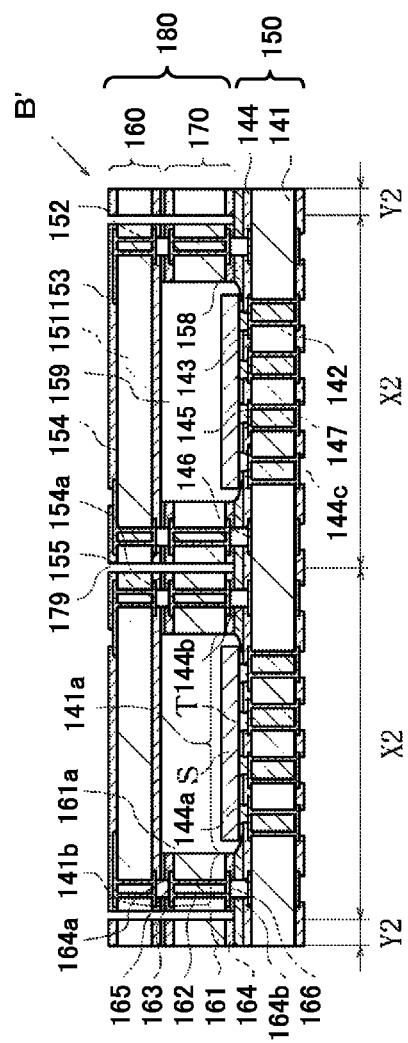
FIG. 7 is a schematic cross-sectional view illustrating an example of another conventional wiring board.

And as illustrated in FIG. 5(d), liquid sealing resin 18 is injected into a gap formed between the base wiring board 10 in the cap joining portion 1b' and the cap wiring board 50 through the resin injection holes 8 in a state in which the base wiring board 10 faces up. In the method for manufacturing the semiconductor element housing wiring board A' according to the present invention, the liquid sealing resin 18 may not flow out onto the base wiring board 10 disposed in the cavity 29 because the sealing resin 18 is injected through the resin injection holes 8 in the state in which the base wiring board 10 faces up.

Lastly, the sealing resin 18 injected between the base wiring board 10 in the cap joining portion 1b' and the cap wiring board 50 is cured, so that preparation of the semiconductor element housing wiring board A' illustrated in FIG. 4 is completed. In this case, since the sealing resin 18 is injected in such a manner that the sealing resin 18 does not flow out onto the base wiring board 10 disposed in the cavity 29, the operation mechanism of the semiconductor element S is unlikely to be covered by the sealing resin 18. Therefore, according to the manufacturing method of the semiconductor element housing wiring board A' according to the present invention, it is possible to provide the semiconductor element housing wiring board A' which enables the semiconductor element S to stably operate by causing the operation mechanism of the semiconductor element S to work normally.

The present invention is not limited to the embodiments described above, and various modifications, improvements, combinations, and the like may be made without departing from the spirit and the scope of the present invention. For example, although the semiconductor element housing wiring board A' of FIG. 4 is not provided with the protrusion 9, the semiconductor element housing wiring board may also include the protrusion 9.

What is claimed is:

1. A wiring board comprising: a base wiring board having an element mounting portion and a frame-shaped frame joining portion surrounding the element mounting portion on an upper surface, and a solder resist layer deposited on the base wiring board in a portion from the element mounting portion to the frame joining portion; and a frame wiring board which is joined to the frame joining portion and surrounds the element mounting portion,
    wherein a first joining pad provided in the frame joining portion of the base wiring board and a second joining pad provided in a lower surface of the frame wiring board are joined together via a solder bump so that a gap is formed between the frame joining portion of the base wiring board and the frame wiring board, and
    the base wiring board has a resin injection hole penetrating through the base wiring board in the frame joining portion, and the gap is filled with a sealing resin.

2. The wiring board according to claim 1, wherein the base wiring board further comprises a frame-shaped protrusion formed on the solder resist layer within the frame joining portion, the resin injection hole penetrates through the protrusion, and a gap formed between the protrusion and the frame wiring board is filled with the sealing resin.

3. The wiring board according to claim 2, wherein the protrusion is formed by a solder resist layer.

4. A semiconductor element housing wiring board comprising: a base wiring board having an element mounting portion and a frame-shaped cap joining portion surrounding the element mounting portion on an upper surface, and a solder resist layer deposited on the base wiring board in a portion from the element mounting portion to the cap joining portion; a semiconductor element mounted in the element mounting portion; and a cap wiring board which is joined to the cap joining portion and has a cavity, in which the semiconductor element is housed, between the cap wiring board and the upper surface of the base wiring board,
    wherein a first joining pad provided in the cap joining portion of the base wiring board and a second joining pad provided in a lower surface of the cap wiring board are joined together via a solder bump so that a gap is formed between the cap joining portion of the base wiring board and the cap wiring board,
    the base wiring board has a resin injection hole penetrating through the base wiring board in the cap joining portion, and the gap is filled with a sealing resin.

5. The semiconductor element housing wiring board according to claim 4, wherein the base wiring board further comprises a frame-shaped protrusion formed on the solder resist layer within the cap joining portion, the resin injection hole penetrates through the protrusion, and a gap formed between the protrusion and the cap wiring board is filled with the sealing resin.

6. The semiconductor element housing wiring board according to claim 5, wherein the protrusion is formed by a solder resist layer.

* * * * *